United States Patent
Chung

(10) Patent No.: US 7,727,850 B2
(45) Date of Patent: Jun. 1, 2010

(54) METHOD FOR FORMING CAPACITOR OF SEMICONDUCTOR DEVICE

(75) Inventor: Woo Young Chung, Yongin-si (KR)

(73) Assignee: Hynix Semiconductor, Inc, Gyeonggi-do (KR)

( * ) Notice: Subject to any disclaimer, the term of this patent is extended or adjusted under 35 U.S.C. 154(b) by 320 days.

(21) Appl. No.: 11/808,338

(22) Filed: Jun. 8, 2007

(65) Prior Publication Data

US 2008/0026537 A1    Jan. 31, 2008

(30) Foreign Application Priority Data

Jul. 28, 2006    (KR) ...................... 10-2006-0071548

(51) Int. Cl.
*H01L 21/20* (2006.01)
(52) U.S. Cl. ...................... 438/398; 438/396
(58) Field of Classification Search .................. 438/396, 438/398
See application file for complete search history.

(56) References Cited

U.S. PATENT DOCUMENTS

| 6,821,846 B2 * | 11/2004 | Shao et al. | 438/253 |
| 2003/0162353 A1 * | 8/2003 | Park | 438/253 |
| 2005/0269618 A1 * | 12/2005 | Shin et al. | 257/309 |

FOREIGN PATENT DOCUMENTS

| KR | 10-2001-0018071 | 3/2001 |
| KR | 10-2004-0002221 | 1/2004 |
| KR | 10-2005-0052874 | 6/2005 |
| KR | 10-2005-0062919 | 6/2005 |
| KR | 10-2005-0064894 | 6/2005 |

* cited by examiner

*Primary Examiner*—Bradley K Smith
(74) *Attorney, Agent, or Firm*—IP & T Law Firm PLC

(57) ABSTRACT

A method for forming a capacitor of a semiconductor device includes forming a first capacitor in a storage node contact region to form a two-stage structured capacitor, thereby increasing the height and the capacitance of the capacitor.

13 Claims, 11 Drawing Sheets

METHOD FOR FORMING CAPACITOR OF SEMICONDUCTOR DEVICE

CROSS-REFERENCE TO RELATED APPLICATION

The present application claims the benefit of priority to Korean patent application number 10-2006-0071548, filed on Jul. 28, 2006, the entire contents of which are incorporated by reference.

BACKGROUND

The present invention relates generally to a method for manufacturing a semiconductor device, and more specifically, to a method for forming a capacitor of a semiconductor device.

The capacitance of a capacitor in a dynamic random access memory (DRAM) may be determined according to the dielectric constant and the thickness of a dielectric material used in the capacitor, and the area of electrodes of the capacitor. In general, the capacitance is directly proportional to the dielectric constant of the dielectric material and the area of the electrodes, and inversely proportional to the thickness of the dielectric material.

Recently, a capacitor having a greater thickness and/or a dielectric material having a higher dielectric constant have been used in order to increase the capacitance of the capacitor.

When the capacitor has a greater thickness, a storage node may become taller. Accordingly, the storage node may be collapsed due to its load in formation of the capacitor.

SUMMARY

Consistent with the invention, there is provided a method for forming a two-stage structured capacitor to increase capacitance of the capacitor.

In one embodiment, a method for forming a capacitor of a semiconductor device comprises the steps of: forming a first interlayer insulating film over a semiconductor substrate; etching the first interlayer insulating film by a photo-etching process with a storage node contact mask to form a first storage node trench; sequentially forming a second interlayer insulating film and a third interlayer insulating film over the first interlayer insulating film including the first storage node trench; etching the second interlayer insulating film and the third interlayer insulating film by a photo-etching process with a storage node mask to form a second storage node trench; forming a storage node conductive layer over the first storage node trench and the second electrode trench to form a storage node; and sequentially forming a dielectric film and an top electrode.

DETAILED DESCRIPTION

The present invention will be described in detail with reference to the accompanying drawings.

Figure 1A:
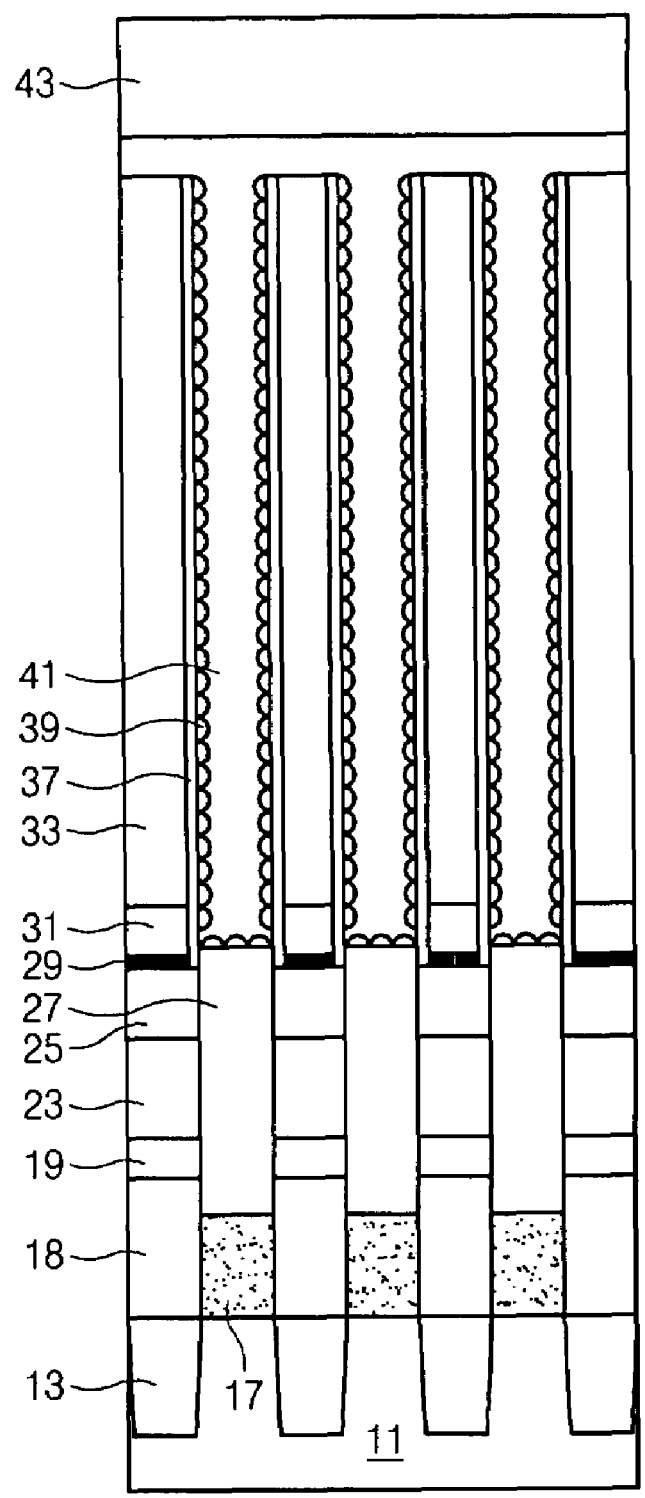
FIGS. 1a and 1b are cross-sectional diagrams illustrating a semiconductor device.
Figure 1B:
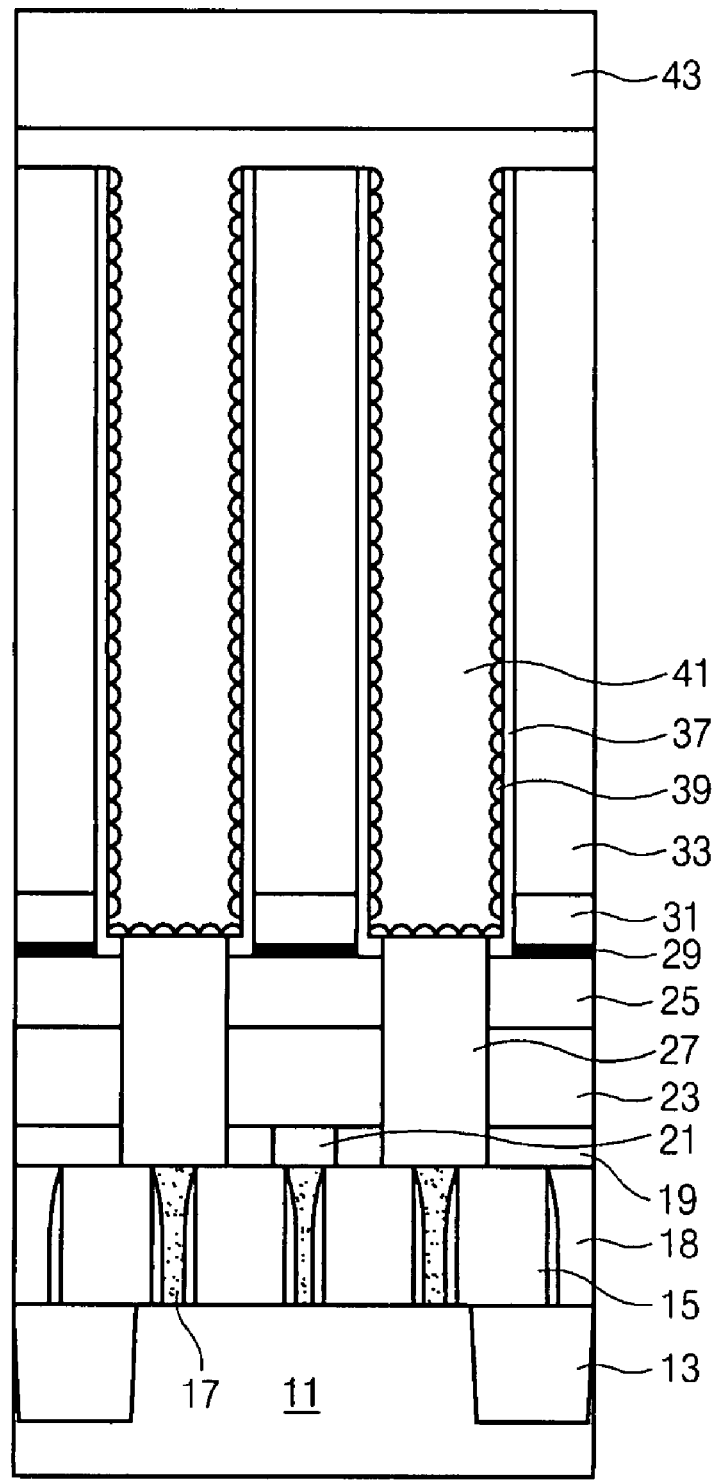

FIGS. 1a and 1b are cross-sectional diagrams illustrating a semiconductor device. FIG. 1a is a cross-sectional diagram taken along a gate length direction, and FIG. 1b is a cross-sectional diagram taken along a direction perpendicular to the gate length direction.

As shown in FIGS. 1a and 1b, a gate 15 is formed over a semiconductor substrate 11 having an isolation layer 13.

A first interlayer insulating film 18 is formed, and a landing plug 17 is formed connecting a bit line contact and a storage node contact.

A second interlayer insulating film 19 including a bit line contact plug 21 is formed over the resulting structure.

A bit line 23 connected to bit line contact plug 21 is formed, and a third interlayer insulating film 25 is formed over bit line 23.

Storage node contact plug 27 connected to landing plug 17 is formed through first interlayer insulating film 18, second interlayer insulating film 19, and third interlayer insulating film 25.

An etching barrier film 29, a fourth interlayer insulating film 31, and a fifth interlayer insulating film 33 are formed over the resulting structure. A photo-etching process may be performed with a storage node mask to etch fourth interlayer insulating film 31 and fifth interlayer insulating film 33, thereby obtaining a trench.

Etching barrier film 29 exposed by the trench is etched, and a storage node conductive film is formed in the trench to obtain a storage node 37.

A meta-stable poly silicon (MPS) layer 39 is grown in storage node 37.

A dielectric film (not shown) and a top electrode 41 are formed over MPS layer 39.

A sixth interlayer insulating film 43 is formed over top electrode 41 to obtain a capacitor.

In order to increase capacitance of the capacitor, the height of storage node 29 may be increased, as shown in FIGS. 1a and 1b. However, due to the increased height, storage node 29 may collapse due to its load.

FIGS. 2a through 6b are cross-sectional diagrams illustrating a method for forming a capacitor of a semiconductor device according to an embodiment consistent with the present invention.

Figure 2A:
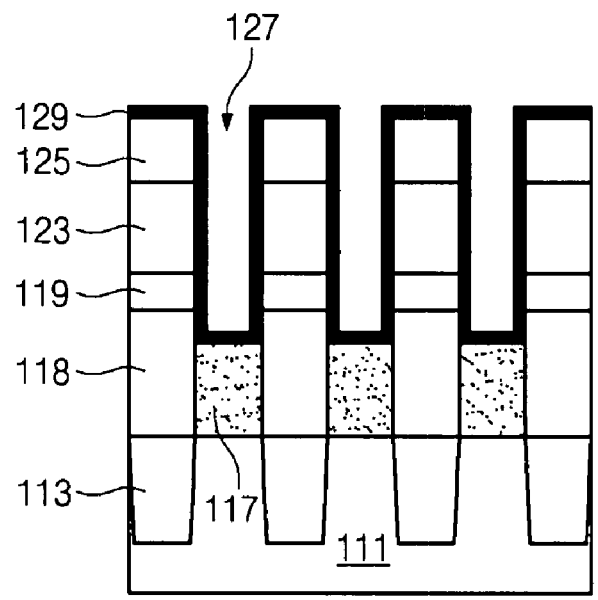
FIGS. 2a through 6b are cross-sectional diagrams illustrating a method for forming a capacitor of a semiconductor device according to an embodiment consistent with the present invention.
Figure 2B:
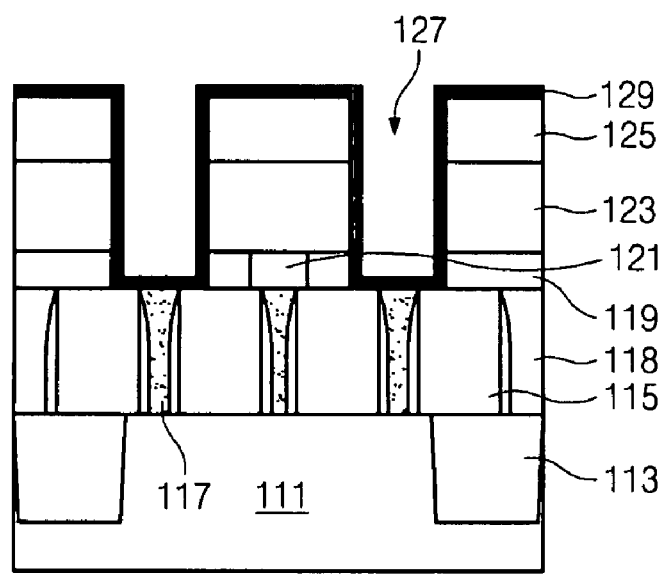

FIGS. 2a and 2b are cross-sectional diagrams illustrating a first storage node trench. FIG. 2a is a cross-sectional diagram taken along a gate length direction, and FIG. 2b is a cross-sectional diagram taken along a direction perpendicular to the gate length direction.

As shown in FIGS. 2a and 2b, a gate 115 is formed over a semiconductor substrate 111 having an isolation layer 113.

A first interlayer insulating film 118 is formed, and a landing plug 117 is formed connecting a bit line contact and a storage node contact.

A second interlayer insulating film 119 including a bit line contact plug 121 is formed over the resulting structure.

A bit line 123 connected to bit line contact plug 121 is formed, and a third interlayer insulating film 125 is formed over bit line 123.

A photo-etching process may be performed with a storage node contact mask to etch first interlayer insulating film 118, second interlayer insulating film 119, and third interlayer insulating film 125, thereby obtaining a first storage node trench 127.

An etching barrier film 129 is formed over third interlayer insulating film 125 including first node trench 127. Etching barrier film 129 includes a nitride film.

Figure 3A:
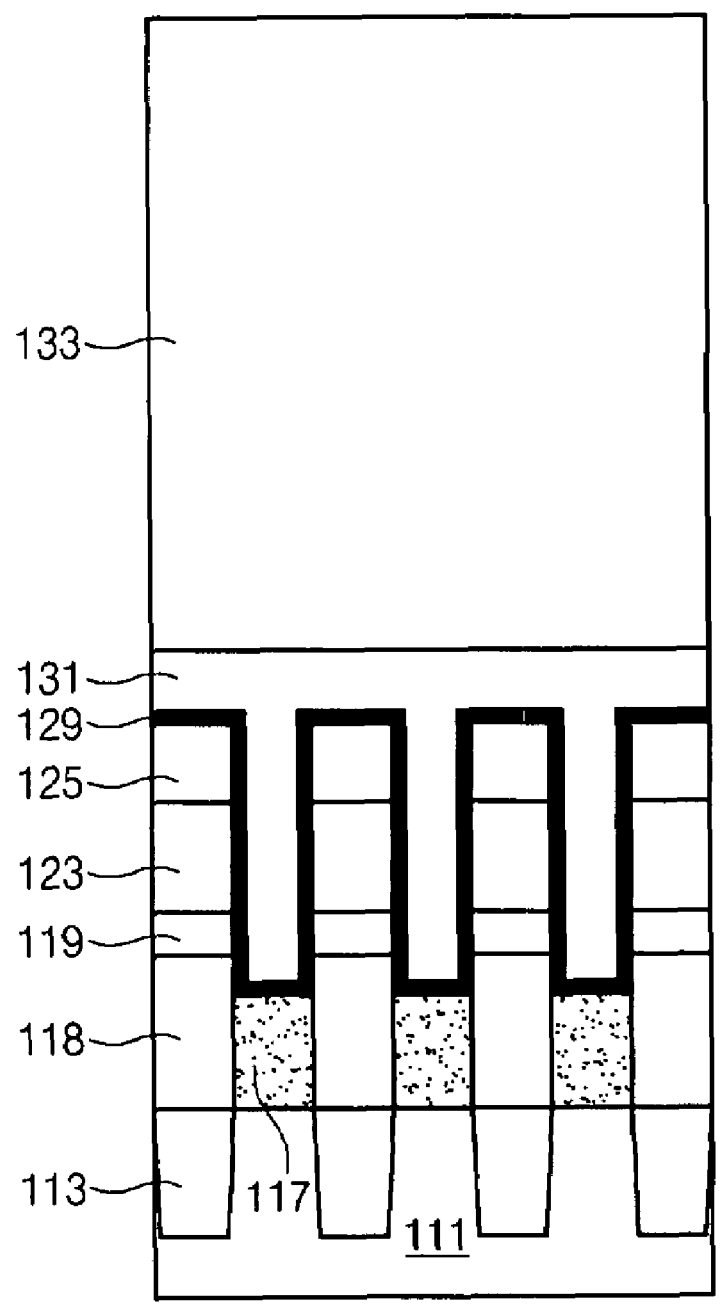
Figure 3B:
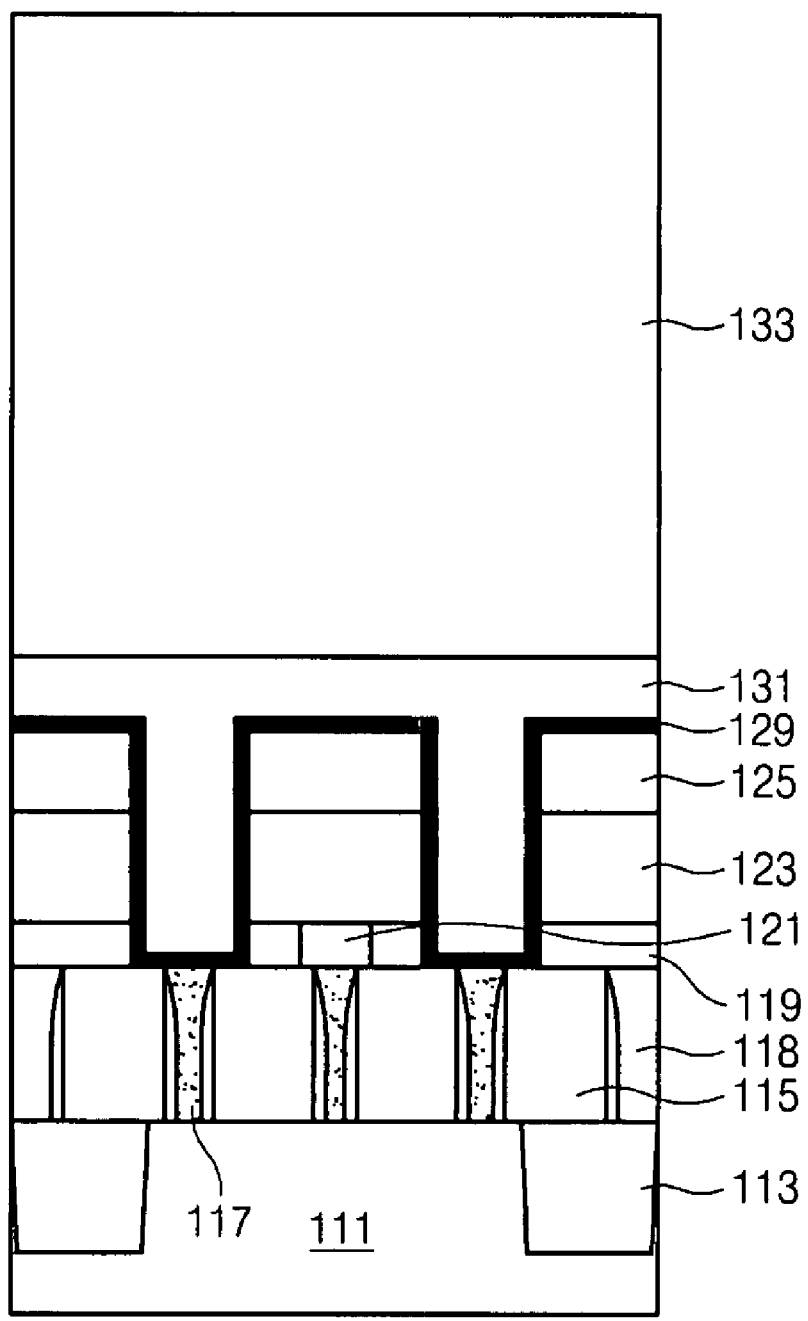

FIGS. 3a and 3b are cross-sectional diagrams illustrating an insulating film. FIG. 3a is a cross-sectional diagram taken along a gate length direction, and FIG. 3b is a cross-sectional diagram taken along a direction perpendicular to the gate length direction.

A fourth interlayer insulating film 131 and a fifth interlayer insulating film 133 are sequentially formed over etching barrier film 129. A planarization process may be performed.

Fourth interlayer insulating film 131 may include a phospho-silicate glass (PSG), and fifth interlayer insulating film 133 may include a tetra-ethyl-ortho-silicate (TEOS).

Fourth interlayer insulating film 131 is formed to have a thickness ranging from about 7000 to 9000 Å. A fifth interlayer insulating film 133 is formed on fourth interlayer insulating film 131 to have a thickness ranging from about 19000 to 21000 Å.

The planarization process may include an etch-back process and a chemical mechanical polishing (CMP) process.

Figure 4A:
Figure 4B:
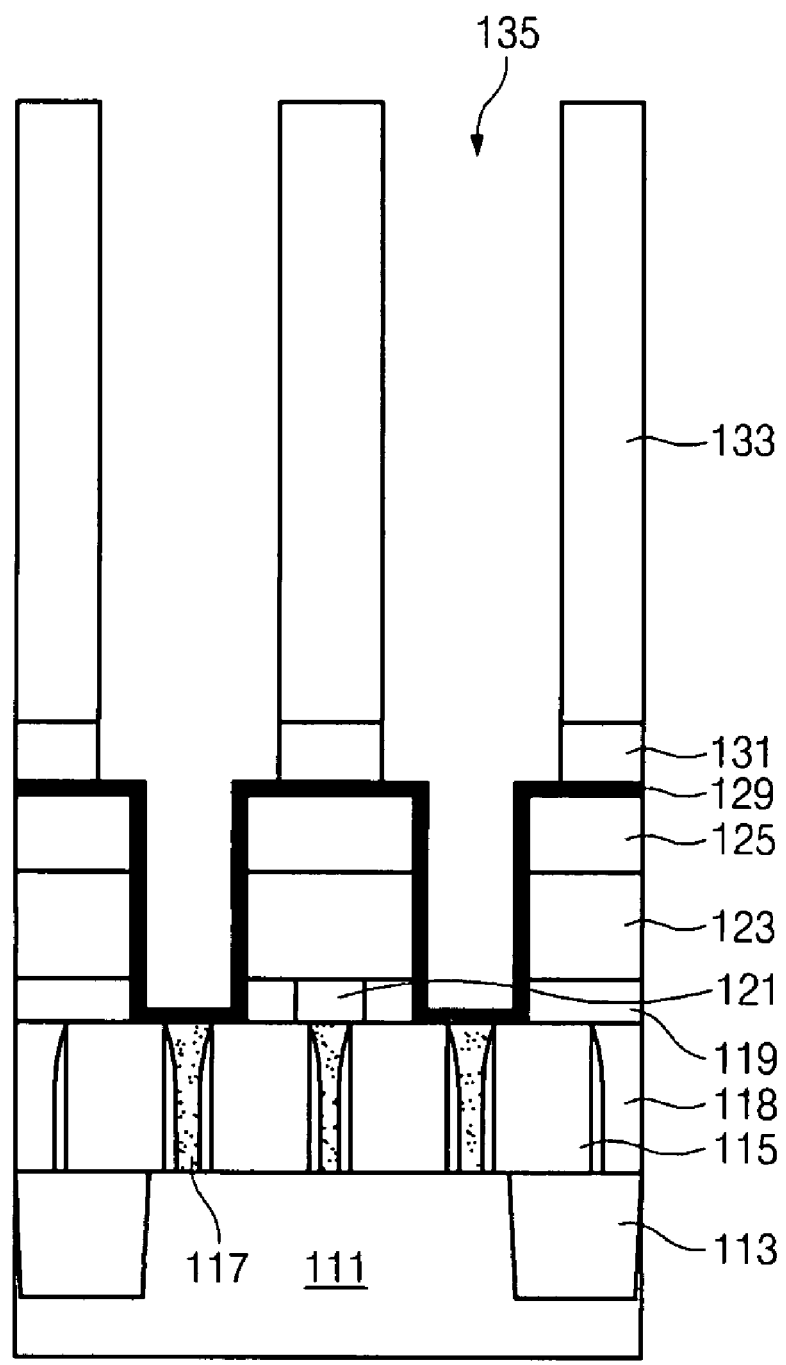

FIGS. 4a and 4b are cross-sectional diagrams illustrating a second storage node trench. FIG. 4a is a cross-sectional diagram taken along a gate length direction, and FIG. 4b is a cross-sectional diagram taken along a direction perpendicular to the gate length direction.

A photo-etching process may be performed with a storage node mask to etch fifth interlayer insulating film 133, thereby obtaining a second storage node trench 135.

When the etching process is performed to form second storage node trench 135, fourth interlayer insulating film 131 is etched by an excessive etching process to regulate the etching ratio so that etching barrier film 129 is exposed.

Figure 5A:
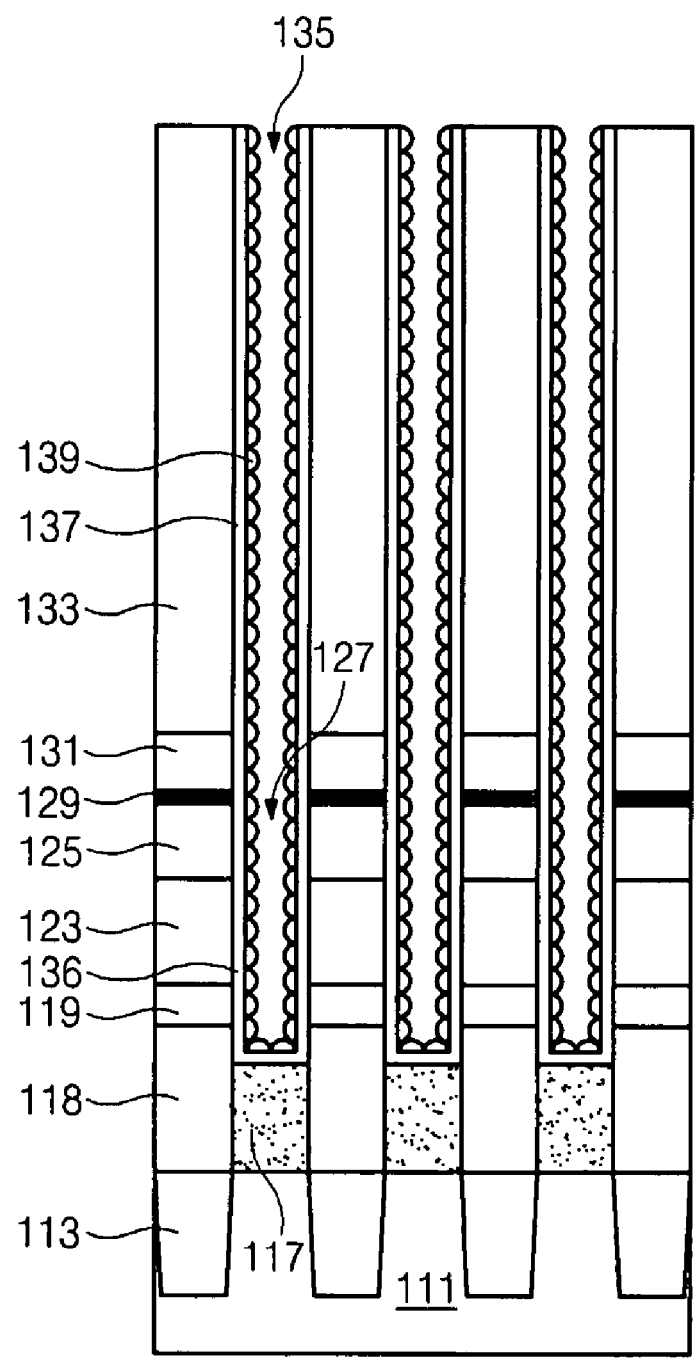
Figure 5B:
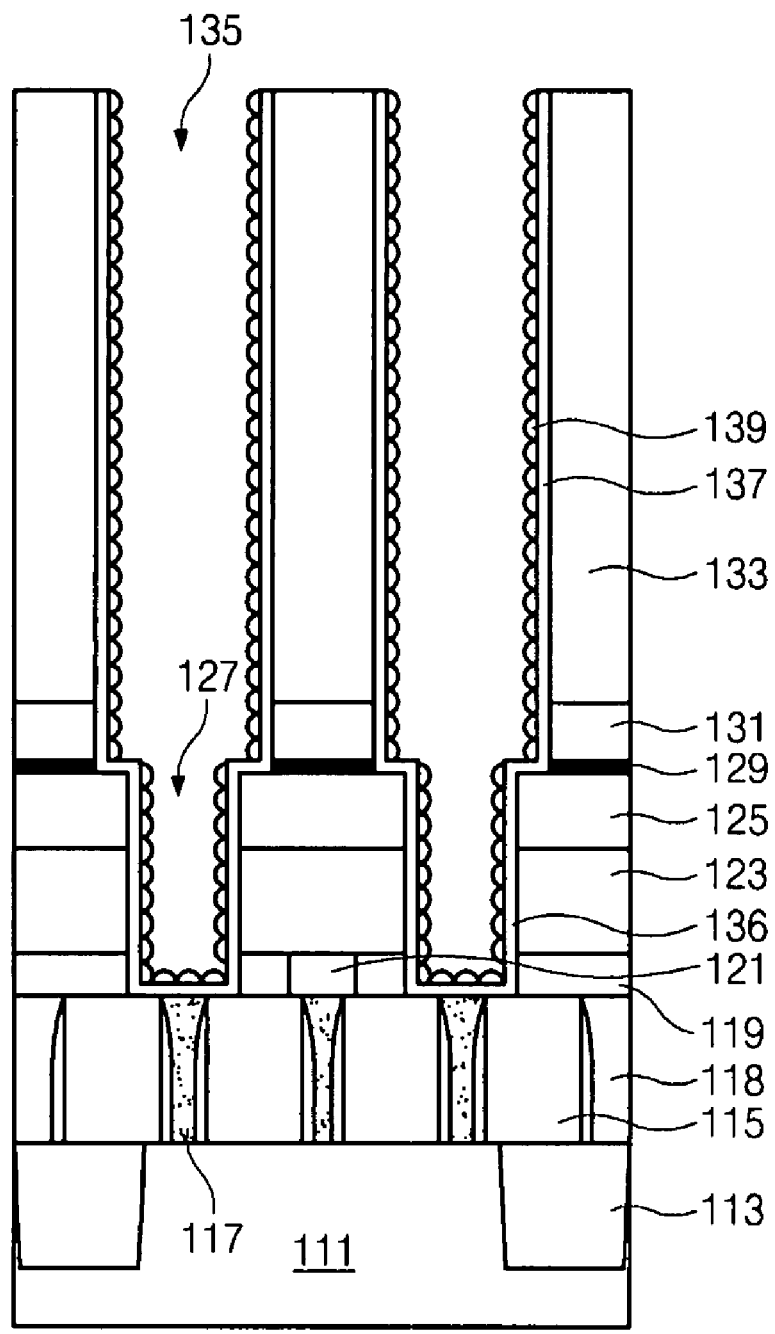

FIGS. 5a and 5b are cross-sectional diagrams illustrating a first storage node and a second storage node. FIG. 5a is a cross-sectional diagram taken along a gate length direction, and FIG. 5b is a cross-sectional diagram taken along a direction perpendicular to the gate length direction.

As shown in FIGS. 5a and 5b, etching barrier film 129 exposed by first storage node trench 127 and second storage node trench 135 is etched.

A storage node conductive layer is formed over first storage node trench 127 and second storage node trench 135, thereby obtaining a first storage node 136 and a second storage electrode 137.

A meta-stable poly silicon (MPS) layer 139 may be grown in first storage node 136 and second storage node 137.

Figure 6A:
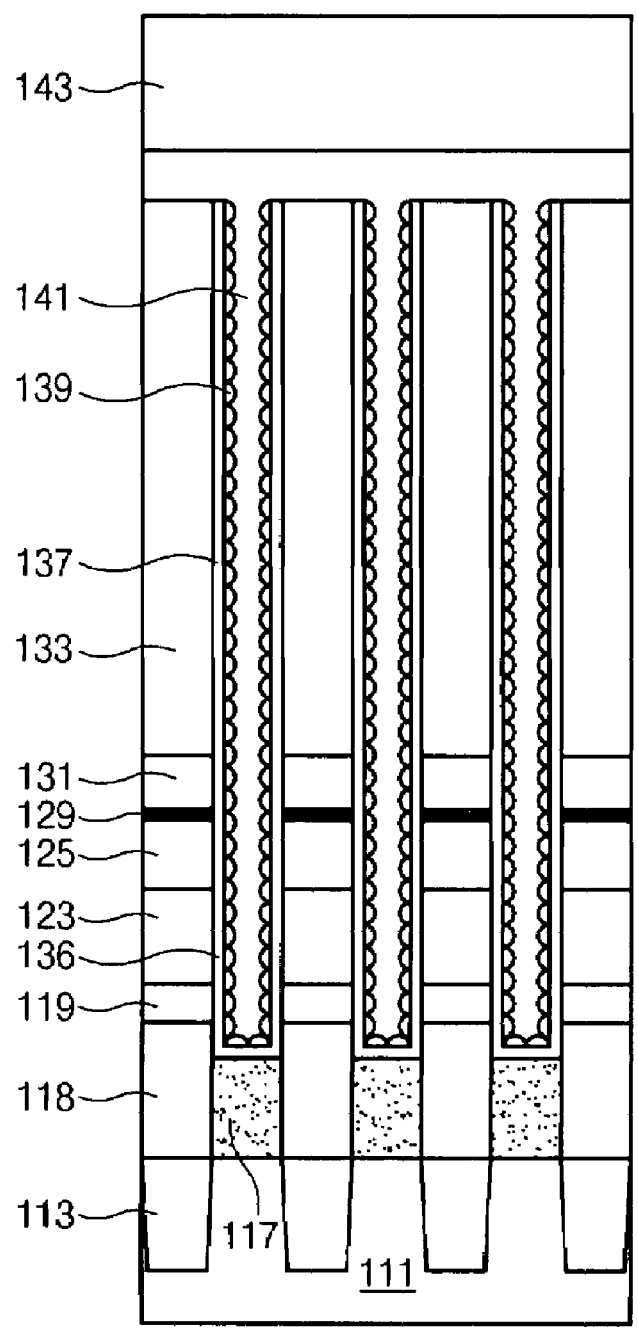
Figure 6B:
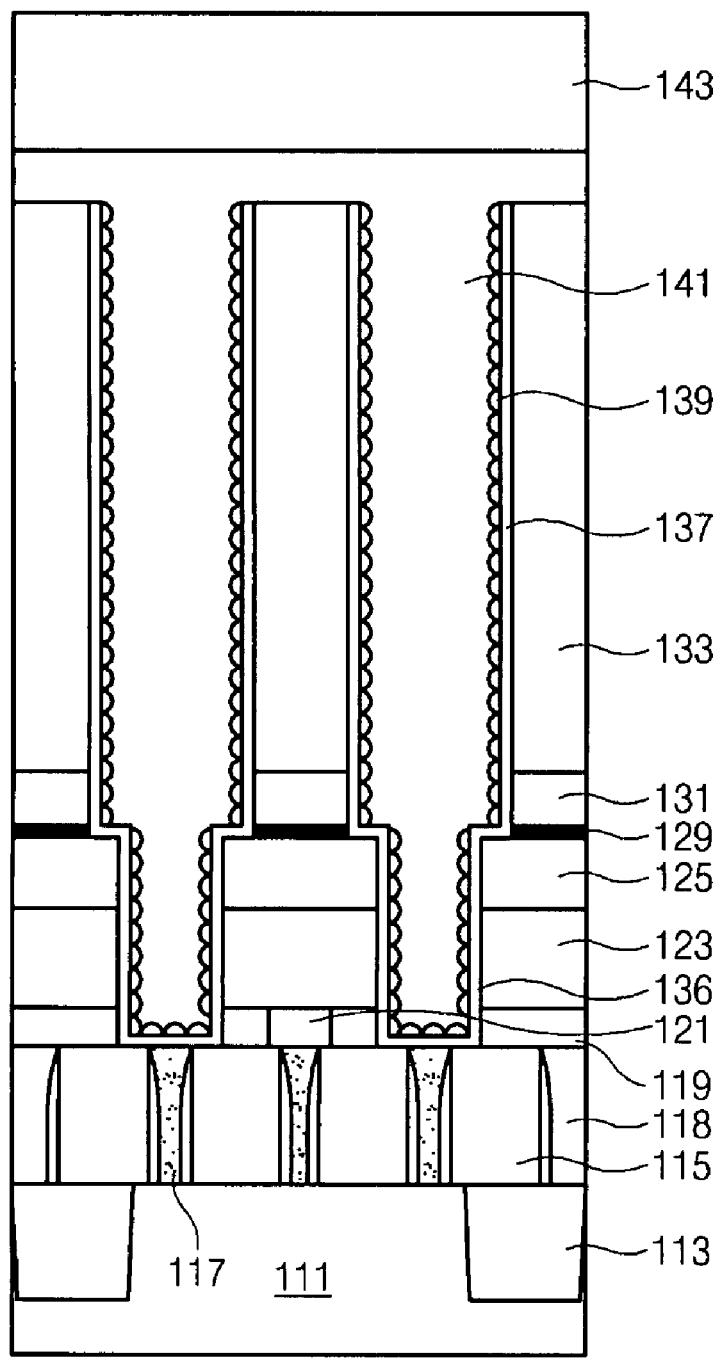

FIGS. 6a and 6b are cross-sectional diagrams illustrating a third interlayer insulating film. FIG. 6a is a cross-sectional diagram taken along a gate length direction, and FIG. 6b is a cross-sectional diagram taken along a direction perpendicular to the gate length direction.

A dielectric film (not shown) and a top electrode 141 are sequentially formed over MPS layer 139.

The dielectric film is selected from a group consisting of oxide-nitride-oxide (ONO), aluminum oxide ($Al_2O_3$), and hydrogen fluoride (HF). Top electrode 141 includes a polysilicon layer.

A sixth interlayer insulating film 143 is formed over top electrode 141.

As described above, in one embodiment, a first capacitor is formed in a storage node contact region to obtain a two-stage structured capacitor, thereby increasing the height and the capacitance of the capacitor.

The above embodiments consistent with the present invention are illustrative and are not restrictive. Various alternatives and equivalents are possible. The invention is not limited by the lithography steps described herein. Nor is the invention limited to any specific type of semiconductor device. For example, the present invention may be implemented in a dynamic random access memory (DRAM) device or in a non-volatile memory device. Other additions, subtractions, or modifications are obvious in view of the present disclosure and are intended to fall within the scope of the appended claims.

What is claimed is:

1. A method for forming a capacitor of a semiconductor device, the method comprising the steps of:
   forming a first interlayer insulating film over a semiconductor substrate;
   etching the first interlayer insulating film by a photo-etching process with a storage node contact mask to form a first storage node trench;
   sequentially forming a second interlayer insulating film and a third interlayer insulating film over the first interlayer insulating film including the first storage node trench;
   etching the second interlayer insulating film and the third interlayer insulating film by a photo-etching process with a storage node mask to form a second storage node trench;
   forming a storage node conductive layer over the first storage node trench and the second storage node trench to form a storage node; and
   sequentially forming a dielectric film and an top electrode over the storage node conductive layer, the dielectric film filling the first storage node trench and the second storage node trench.

2. The method according to claim 1, further comprising forming an etching barrier film over the first interlayer insulating film including the first storage node trench, wherein portions of the etching barrier film is exposed by the first storage node trench and the second storage node trench.

3. The method according to claim 2, further comprising etching the exposed portions of the etching barrier film.

4. The method according to claim 2, wherein the etching barrier film includes a nitride film.

5. The method according to claim 1, wherein the second interlayer insulating film includes a phospho-silicate-glass (PSG).

6. The method according to claim 5, wherein the second interlayer insulating film is formed to have a thickness ranging from about 7000 to 9000 Å.

7. The method according to claim 1, wherein the third interlayer insulating film includes a tetra-ethyl-ortho-silicate (TEOS).

8. The method according to claim 7, wherein the third interlayer insulating film is formed to have a thickness ranging from about 19000 to 21000 Å.

9. The method according to claim 1, further comprising performing a planarization process after the forming-a-third-interlayer-insulating-film step.

10. The method according to claim 9, wherein the planarization process includes at least one of an etch-back process and a chemical mechanical polishing (CMP) process.

11. The method according to claim 1, wherein the storage node conductive layer and the top electrode include a polysilicon layer.

12. The method according to claim 1, wherein the dielectric film includes at least one selected from the group consisting of oxide-nitride-oxide (ONO) and aluminum oxide ($Al_2O_3$).

13. The method according to claim 1, further comprising growing a meta-stable poly silicon (MPS) layer in the storage node.

* * * * *